(12) United States Patent
Lin

(10) Patent No.: US 7,394,251 B2
(45) Date of Patent: Jul. 1, 2008

(54) DYNAMIC MAGNETIC RESONANCE INVERSE IMAGING

(75) Inventor: Fa-Hsuan Lin, Brookline, MA (US)

(73) Assignee: General Hospital Corporation, Boston, MA (US)

( * ) Notice: Subject to any disclaimer, the term of this patent is extended or adjusted under 35 U.S.C. 154(b) by 0 days.

(21) Appl. No.: 11/484,091

(22) Filed: Jul. 11, 2006

(65) Prior Publication Data

US 2008/0012564 A1    Jan. 17, 2008

Related U.S. Application Data

(60) Provisional application No. 60/745,218, filed on Apr. 20, 2006.

(51) Int. Cl.
*G01V 3/00* (2006.01)

(52) U.S. Cl. ........................ 324/309; 324/307

(58) Field of Classification Search ................ 324/309, 324/307, 306; 600/410
See application file for complete search history.

(56) References Cited

U.S. PATENT DOCUMENTS

| | | | |
|---|---|---|---|
| 4,193,152 A | 3/1980 | Seibold, Jr. | |
| 5,568,050 A | 10/1996 | Hennig | |
| 5,885,215 A | 3/1999 | Dossel et al. | |
| 6,195,576 B1 | 2/2001 | John | |
| 6,949,928 B2 * | 9/2005 | Gonzalez Ballester et al. | ... 324/307 |
| 7,218,959 B2 * | 5/2007 | Alfano et al. | ............... 600/476 |
| 2005/0111715 A1 * | 5/2005 | Yoo et al. | ................... 382/128 |

FOREIGN PATENT DOCUMENTS

WO    WO 2005/109010 A2    11/2005

OTHER PUBLICATIONS

Sodickson DK, Manning WJ, "Simultaneous Acquisition Of Spatial Harmonics (SMASH) Fast Imaging With Radiofrequency Coil Arrays", Magn. Reson. Med. 1997;38(4):591-603.
Pruessman KP, Weiger M, Scheidegger MB, Boesiger P, "Sense: Sensitivity Encoding For Fast MRI", Magn. Reson. Med. 1999;42(5):952-962.
McDougalli MP, Wright SM, "64-Channel Array Coil For Single Echo Acquisition Magnetic Resonance Imaging", Magn. Reson. Med. 2005;54(2):386-392.
Griswold, et al, "Generalized Autocalibrating Partially Parallel Acquisitions (GRAPPA)", Magn. Reson. Med. 47:1201-1210 (2002).

* cited by examiner

*Primary Examiner*—Louis M. Arana
(74) *Attorney, Agent, or Firm*—Quarles & Brady LLP

(57) ABSTRACT

An fMRI scan is performed using a multi-element head coil and multi-channel receiver to acquire time course image data. One imaging gradient is eliminated from the pulse sequence used to acquire the time course image data enabling images to be acquired at a very high frame rate. The multi-channel NMR data is combined and reconstructed into a series of image frames using an imaging inversion operator.

12 Claims, 7 Drawing Sheets

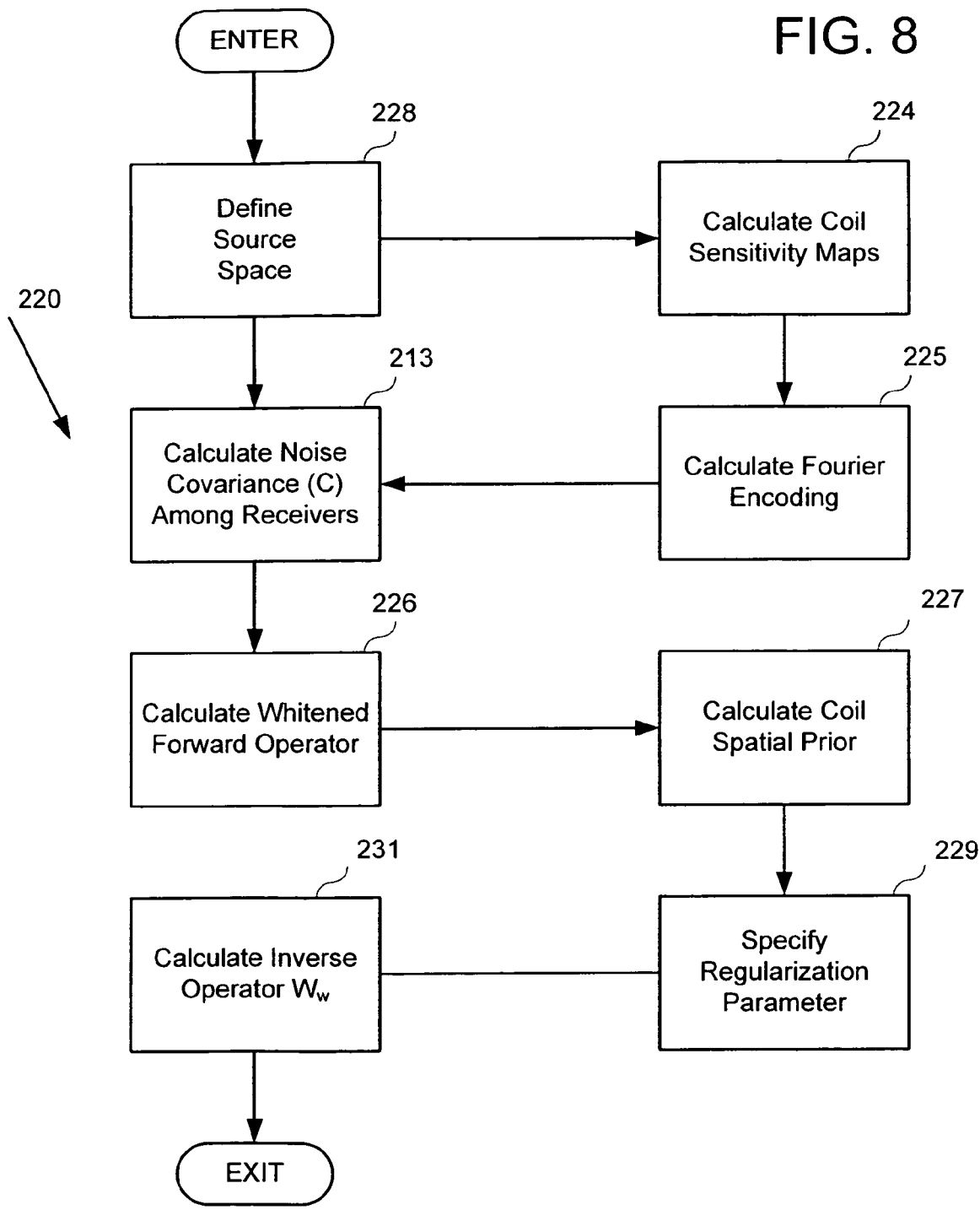

DYNAMIC MAGNETIC RESONANCE INVERSE IMAGING

CROSS-REFERENCE TO RELATED APPLICATIONS

This application is based on U.S. Provisional Patent Application Ser. No. 60/745,218 filed on Apr. 20, 2006 and entitled "Dynamic Magnetic Resonance Inverse Imaging".

BACKGROUND OF THE INVENTION

The field of the invention is nuclear magnetic resonance imaging (MRI) methods and systems. More particularly, the invention relates to dynamic studies in which a series of MR images are acquired at a high temporal resolution.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, Mz, may be rotated, or "tipped", into the x-y plane to produce a net transverse magnetization. A NMR signal is emitted by the excited spins after the excitation signal $B_1$ is terminated, and this NMR signal may be received and processed to form an image.

When utilizing these signals to produce images, magnetic field gradients ($G_x$, $G_y$ and $G_z$) are employed. Typically, the region to be imaged is scanned, or sampled, by a sequence of measurement cycles in which these gradients vary according to the particular localization method being used. The resulting set of received NMR signals are digitized and processed to reconstruct the image using one of many well known reconstruction techniques.

There are many methods used to sample 2D or 3D "k-space" during an MRI scan. The most common method in use today is the Fourier transform (FT) imaging technique, which is frequently referred to as "spin-warp". The spin-warp technique is discussed in an article entitled "Spin-Warp NMR Imaging and Applications to Human Whole-Body Imaging" by W. A. Edelstein et al., Physics in Medicine and Biology, Vol. 25, pp. 751-756 (1980). It employs a variable amplitude phase encoding magnetic field gradient pulse prior to the acquisition of NMR echo signals to phase encode spatial information in the direction of this gradient. In a two-dimensional implementation (2DFT), for example, spatial information is encoded in one direction by applying a phase encoding gradient ($G_y$) along that direction, and then an NMR echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of views that are acquired during the scan to produce a set of NMR data from which an entire image can be reconstructed. A 3DFT scan is similar except a second phase encoding gradient directed along the third axis is also stepped through a set of values.

To reduce the time needed to acquire data for an MR image multiple NMR signals may be acquired in the same pulse sequence. The echo-planar pulse sequence was proposed by Peter Mansfield (J. Phys. C. 10: L55-L58, 1977). In contrast to standard pulse sequences, the echo-planar pulse sequence produces a set of NMR signals for each RF excitation pulse. These NMR signals can be separately phase encoded so that an entire scan of 64 views can be acquired in a single pulse sequence of 20 to 100 milliseconds in duration. The advantages of echo-planar imaging ("EPI") are well-known, and this method is commonly used where the clinical application requires a high temporal resolution. Echo-planar pulse sequences are disclosed in U.S. Pat. Nos. 4,678,996; 4,733,188; 4,716,369; 4,355,282; 4,588,948 and 4,752,735.

A variant of the echo-planar imaging method is the Rapid Acquisition Relaxation Enhanced (RARE) sequence which is described by J. Hennig et al in an article in Magnetic Resonance in Medicine 3, 823-833 (1986) entitled "RARE Imaging: A Fast Imaging Method for Clinical MR." The essential difference between the RARE (also called a fast spin-echo or FSE) sequence and the EPI sequence lies in the manner in which NMR echo signals are produced. The RARE sequence, utilizes RF refocused echoes generated from a Carr-Purcell-Meiboom-Gill sequence, while EPI methods employ gradient recalled echoes.

Other MRI pulse sequences are known which sample 2D or 3D k-space without using phase encoding gradients. These include the projection reconstruction methods known since the inception of magnetic resonance imaging and again being used as disclosed in U.S. Pat. No. 6,487,435. Rather than sampling k-space in a rectilinear, or Cartesian, scan pattern by stepping through phase encoding values as described above and shown in FIG. 2, projection reconstruction methods sample k-space with a series of views that sample radial lines extending outward from the center of k-space as shown in FIG. 3. The number of projection views needed to sample k-space determines the length of the scan and if an insufficient number of views are acquired, streak artifacts are produced in the reconstructed image. There are a number of variations of this straight line, radial sampling trajectory in which a curved path is sampled. These include spiral projection imaging and propeller projection imaging.

Recently, parallel MRI scanning methods using spatial information derived from the spatial distribution of the receive coils and a corresponding number of receiver channels has been proposed to accelerate MRI scanning. This includes the k-space sampling methods described in Sodickson D K, Manning W J, "Simultaneous Acquisition Of Spatial Harmonics (SMASH)" Fast Imaging With Radiofrequency Coil Arrays", Magn. Reson. Med. 1997; 38(4):591-603, or Griswold M A, Jacob P M, Heidemann R M, Nittka M, Jellus V, Wang J, Kiefer B, Hasse A, "Generalized Autocalibrating Partially parallel Acquisitions (GRAPPA)", Magn. Reson. Med. 2002; 47(6):1202-1210, or Pruessmann K P, Weiger M, Scheidegger M B, Boesiger P, "SENSE: Sensitivity Encoding For Fast MRI", Magn. Reson. Med. 1999; 42(5):952-962, all of which share a similar theoretical background. Parallel MRI accelerates image data acquisition at the cost of reduced signal-to-noise ratio (SNR). The temporal acceleration rate is limited by the number of coils in the array and the number of separate receive channels, and the phase-encoding schemes used. Typically, acceleration factors of 2 or 3 are achieved.

Mathematically, the attainable acceleration in parallel MRI is limited by the available independent spatial information among the channels in the array. The parallel MRI image reconstruction manifests itself as a problem in solving an over-determined linear system using this spatial information. Therefore, advances in the coil array design with more coil elements and receiver channels can increase the acceleration rate when using the parallel MRI technique. Recently, optimized head coil arrays have been extended from 8-channel as described in de Zwart J A, Ledden P J, Kellman P, van Gelderen P. Duyn J H, "Design Of A SENSE-Optimized High-Sensitivity MRI Receive Coil For Brain Imaging", Magn. Reson. Med. 2002; 47(6):1218-1227, to 16-channel as described in de Zwart J A, Ledden P J, van Gelderen P, Bodurka J, Chu R, Duyn J H, "Signal-To-Noise Ratio And Parallel Imaging Performance Of A 16-Channel Receive-Only Brain Coil Array At 3.0 Tesla", Magn. Reson. Med. 2004; 51(1):22-26, as well as 23 and 90-channel arrays as described in Wiggins G C, Potthast A, Triantafyllou C, Lin F-H, Benner T, Wiggins C J, Wald L L, "A 96-Channel MRI System With 23- and 90-Channel Phase Array Head Coils At 1.5 Tesla", 2005; Miami, Fla., USA, International Society for Magnetic Resonance in Medicine, p 671.

As described recently by McDougall M P, Wright S M, "64-Channel Array Coil For Single Echo Acquisition Magnetic Resonance Imaging", Magn. Reson. Med. 2005; 54(2): 386-392, a dedicated 64-channel linear planar array was developed to achieve 64-fold acceleration using a single echo acquisition (SEA) pulse sequence and a SENSE reconstruction method. The SEA approach depends on the linear array layout and localized RF coil sensitivity in individual receiver channels to eliminate the phase encoding steps required in conventional imaging. The challenge of this approach is the limited sensitivity in the perpendicular direction to the array plane and the extension of the methodology to head-shaped geometries.

SUMMARY OF THE INVENTION

The present invention is a method for acquiring MR image data and for reconstructing images from such data that enables the elimination of one or more imaging gradients. More specifically, the method includes acquiring NMR data from the field of view using multiple coils and corresponding multiple receive channels and combining the data from the multiple coils using an imaging inverse operator derived from a forward model that accounts for the NMR signals received by each coil and its associated receive channel.

A general object of the invention is to shorten scan time by reducing reliance on imaging gradients. By eliminating one, two or three imaging gradients using the present invention, the pulse sequence used to acquire NMR image data is shortened and the number of repetitions of the pulse sequence is either reduced or eliminated altogether. Unlike prior parallel MRI imaging methods, the imaging inverse operator also allows reconstruction in the underdetermined case: where the rate of the accelerated image exceeds the number of RF array channels. For example, if in rate=4 SENSE, ¼ of the k-space data needed for an unaliased image is sampled with 8 receive channels. In the present invention, the effective Rate (reciprocal of the ratio of sampled k-space points to that needed for an unaliased reconstruction), can exceed the number of RF array channels present. If the gradient encoding is completely eliminated (one k-space sample) then the present invention can generate an image solely using the spatial information in the array of multiple receive coils.

Another object of the invention is to increase the temporal resolution in dynamic MRI studies. By using the present invention phase encoding can be eliminated from an fMRI pulse sequence and image frames can be acquired at a very high frame rate. As a result, the time resolution of the resulting time course fMRI data is much higher.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

BRIEF DESCRIPTION OF THE DRAWINGS

FIG. 8 is a flow chart which illustrates the steps used to prepare the imaging inverse operator in the method of FIG. 6.

GENERAL DESCRIPTION OF THE INVENTION

Figure 1:
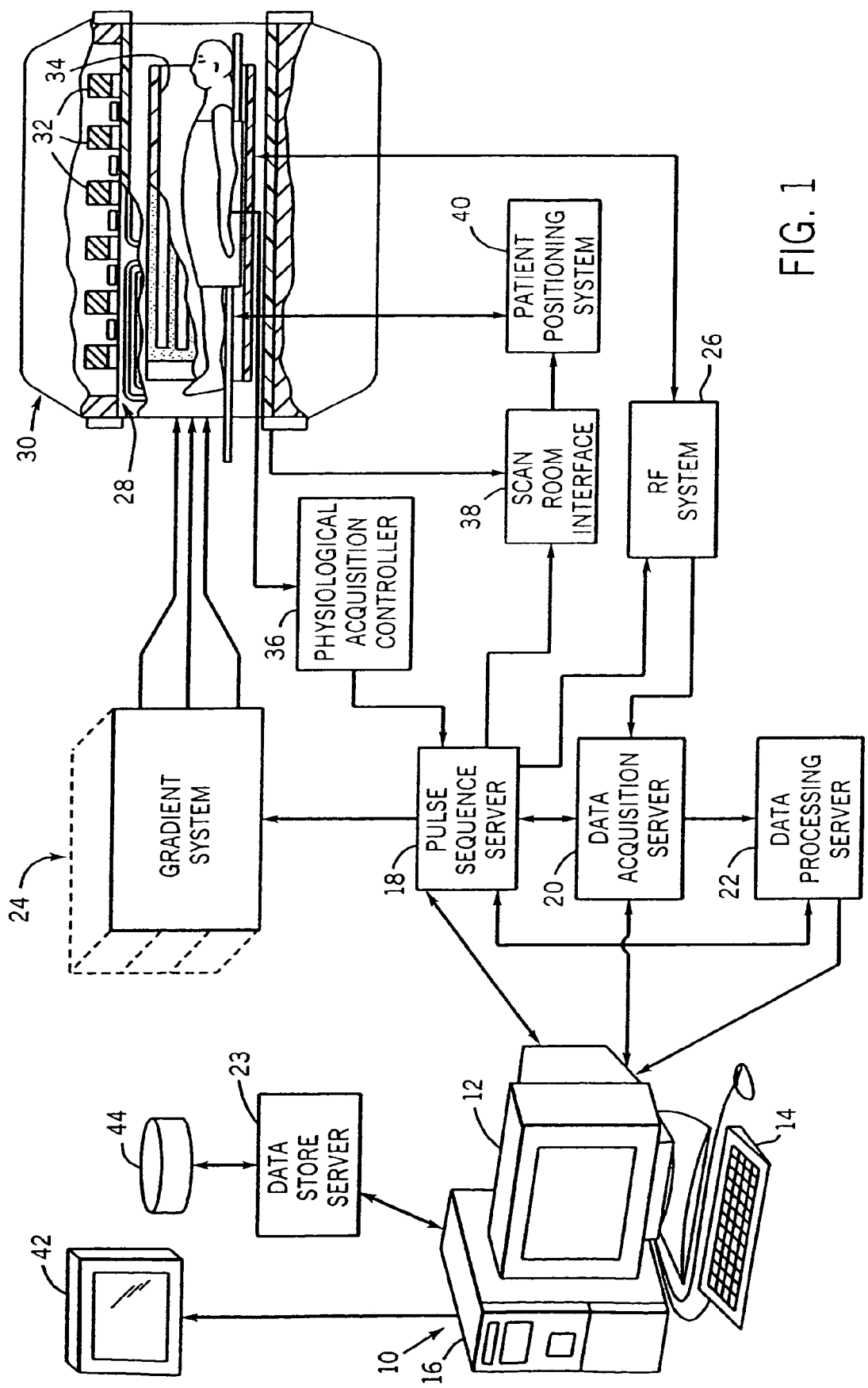
FIG. 1 is a block diagram of an MRI system which employs the present invention.
Figure 2:
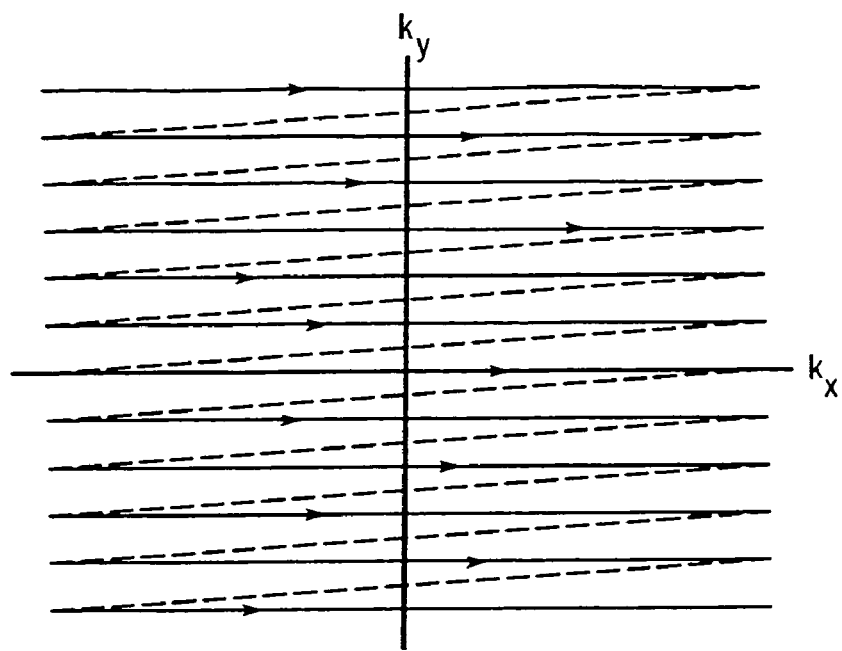
FIG. 2 is a graphic illustration of the Cartesian, or Fourier k-space sampling pattern.
Figure 3:
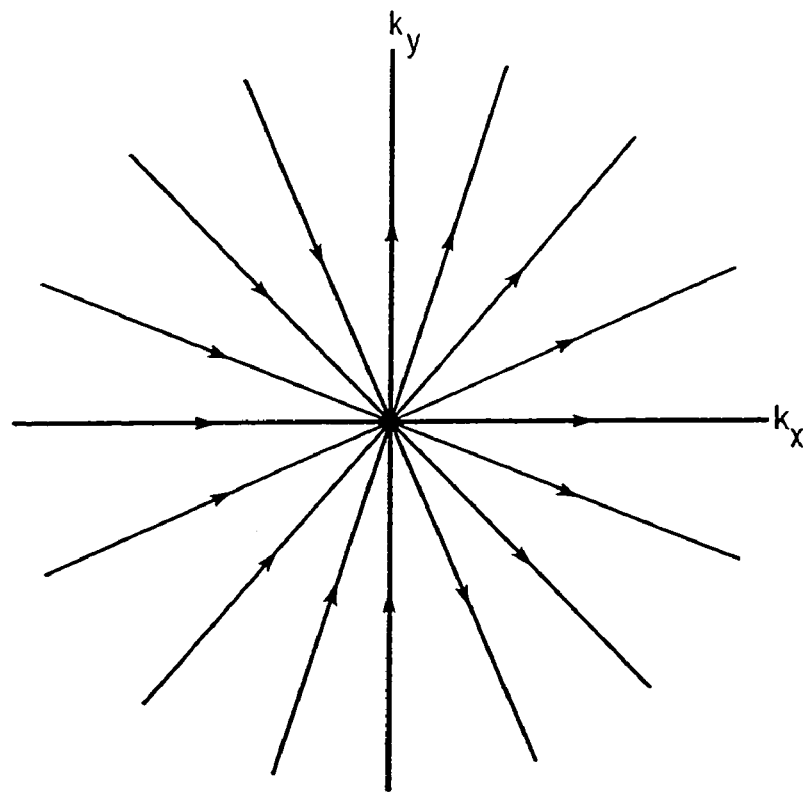
FIG. 3 is a graphic illustration of a radial, or projection reconstruction k-space sampling pattern.

The present invention employs an rf coil array with separate coil elements positioned at different locations relative to the subject positioned in the field of view (FOV). Each coil element receives an NMR echo signal which is separately amplified, digitized and processed according to the present invention to reconstruct an image.

The generation of time series image y(t) on an $n_c$-channel RF coil array in MRI can be formulated as:

$$y(t)=Ax(t)+n(t), \quad (1)$$

where t indicates time, and y(t) is an $(n_a \cdot n_c)$-by-1 vector with $n_a$ vertical stacks (of k-space samples) with $n_c$ observations (number of array channels), x(t) is an $n_\rho$-by-1 vector denoting the image to be reconstructed, n(t) is a $(n_a \cdot n_c)$-by-1 vector denoting the contaminating noise in the coils, and A is the "forward operator", which maps the signals to the coil array observations. Here we introduce the symbol r to indicate the "acceleration rate", the ratio between the number of fully sampled k-space data ($n_\rho$) and the number of k-space samples in the accelerated dynamic scan ($n_a$). Usually $n_a \leq n_\rho$. In Fourier MR imaging, the forward operator for the $n^{th}$ coil in the array can be further decomposed into Fourier encoding part (E) and coil sensitivity modulation part ($P_n$):

$$A_n = EP_n, n = 1 \ldots n_c, A = \begin{bmatrix} A_1 \\ \vdots \\ A_n \end{bmatrix}. \quad (2)$$

The coil sensitivity describes how the spin density is modulated by the reception profile of each coil element in the RF coil array; it is thus different among the coils in the array. The Fourier encoding matrix, however, is identical for all coils in the array due to the same applied gradients. Given the k-space trajectory $E=\Phi_{n_a}^{-1}S\Phi_{n_\rho}$, where S is the sampling matrix of size $n_a$-by-$n_\rho$ consisting of row vectors of the discrete data delta function. In the $i^{th}$ row of S, the $j^{th}$ element is 1, if the k-space spatially indexed entry j is sampled, and 0 everywhere else. $\Phi_{n_\rho}$ is the discrete Fourier transform matrix of size $n_\rho$. In addition, we can also incorporate the off-resonance phase information and thus formulate the "phase-constrained" forward problem by factoring out the real and imaginary parts. The purpose of phase-constrained forward problem is to enable dynamic statistical inference with either positive or negative values to infer the MR signal to be higher or lower than the baseline signal. This is because we explicitly constrain x(t) to be a real-valued vector. We describe the details below.

In an ensemble of parallel MRI acquisitions, the noise can be characterized with the noise covariance matrix, C. The forward problem is first "whitened" to facilitate the formulation without a loss of generality. Employing the Cholesky decomposition of the noise covariance matrix, C, the whitened forward equation is written:

$$y_w(t) = A_w x(t) + n_w(t), \tag{3a}$$

$$y_w(t) = C^{1/2} y(t), \tag{3b}$$

$$A_w = C^{1/2} A, \tag{3c}$$

$$\langle n_w(t) n_w(t)^H \rangle = I_{n_c} \tag{3d}$$

Here the superscript H indicates the complex conjugate and transpose. $\langle \bullet \rangle$ represents the average across ensembles, and $I_{n_c}$ is the identity matrix of size $n_c$-by-$n_c$.

In MR inverse imaging ("InI") according to the present invention, the spatial locations corresponding to elements of x(t) constitute the source space. In practice, the source space can be a 3-dimensional volumetric space representing multiple partitions in conventional 3D MRI. This 3D InI source space corresponds to using non-selective excitation over the whole VOI and acquires only the central point of the k-space volume for InI reconstruction. It is also possible to have a 2-dimensional planar InI source space if a slice selection gradient is employed in the pulse sequence to constrain the image to be reconstructed from a single plane (2D InI). Similarly, a 1-dimensional linear InI source space is possible if both slice selection and frequency-encoding gradients are employed in the pulse sequence (1D InI). Coil sensitivity profiles are used to resolve this uncertainty. Finally, incorporating a limited amount of phase encoding steps, such as in traditional parallel MRI SENSE/MASH/GRAPPA, InI source space can be further restricted.

In dynamic MR imaging where a series of time resolved images is acquired, a priori information about the subject in the FOV is usually available. The incorporation of such a priori information can improve the image reconstruction quality in anatomical and dynamic functional MRI. We can include the option of using a priori information in the dynamic InI framework. Denoting the time-invariant prior for the solution by $\vec{x}_0$, the forward problem can be re-written as:

$$y_w'(t) = A_w x'(t) + n(t)$$

$$= y_w(t) - A_w x_0,$$

$$x'(t) = x(t) - x_0$$

$$y'(t) = y(t) - A x_0 \tag{4}$$

The subsequent derivation of the minimum-norm solution will incorporate the a priori information to yield time-resolved images x(t). However, if no prior information is available, we can experimentally define the "baseline interval" to estimate the $A_w x_0$ term. For example, the averaged InI accelerated measurements over a baseline interval can generate the averaged baseline activity estimate, which will be subtracted from the dynamic InI measurements in the "activity interval" to generate $y_w'(t)$. In the following section, we will show that the spatial distribution of the dynamic change can still be resolved simply based on $y_w'(t)$ without spatial prior $x_0$.

The stability of the solution for x'(t) depends on the condition of the forward operator. Traditional parallel MRI methods limits the forward operator such that $A_w$ has more rows than columns. In practice, this constrains the acceleration rate (r) to be less than or equal to the number of coils in the array ($n_c$). Mathematically, this is equivalent to the requirement of the existence of $(A_w^H A_w)^{-1}$. This is explicitly required in the SENSE and GRAPPA image reconstruction methods. Nevertheless, in extremely accelerated cases, the Fourier encoding matrix has a very small number of rows, and thus $(A_w^H A_w)$ is very ill-conditioned. In other words, dynamic InI may encounter the inverse problem where there are more unknowns than observations. In light of the ill-posed dynamic InI, the solution can be approached by adding constraints. One common choice is the linear minimum-norm estimate, which minimizes the following cost function:

$$\hat{x}'(t) = \underset{\bar{x}'}{\mathrm{argmin}} \{\|y_w'(t) - A_w x'(t)\|_2^2 + \lambda^2 \|x'(t)\|_2^2\}, \tag{5}$$

where $\|\bullet\|_2^2$ is the square of the $l_2$-norm and $\lambda^2$ is the regularization parameter. The cost function consists of two parts: the first is the model error term, which quantifies the discrepancy between measured data and modeled error, and the second is the prior error term, which quantifies the solution deviation from the prior. The second term in the cost function implies searching a solution x(t) minimizing the deviation from the prior $x_0$ (in the $l_2$-norm sense). The "minimum-norm" estimate, $\hat{x}'(t)$, thus corresponds to a solution with minimum cost. The solution is provided by the linear inverse operator $W_w$:

$$\hat{x}'(t) = W_w y_w'(t) = R A_w^H (A_w R A_w^H + \lambda^2 I_N)^{-1} y_w'(t), \tag{6}$$

where R is the source covariance matrix:

$$R = \langle x'(t) x'(t)^H \rangle = \langle x(t) x(t)^H \rangle \tag{7}$$

Given the prior information, we have $$\hat{x}(t) =$$
$$\hat{x}'(t) + x_0 = W_w y_w'(t) + x_0 = W_w y_w(t) + (I - \Psi) x_0 = W_w y_w(t) + \Delta x_0, \tag{8}$$

where $\psi = W_w A_w$ denotes the resolution kernel, and $\Delta = I - \psi$ denotes the deviation kernel. The resolution kernel is important in quantifying the spatial resolution of the InI image reconstruction, as described in the following section.

The minimum-norm estimate of the dynamic InI can be generalized to the traditional parallel MRI as the case of under-determined parallel MRI reconstruction. Assuming $(A_w R A_w^H + \lambda^2 I_N)$ and $(A_w^H A_w + \lambda^2 R^{-1})$ are both invertible, we have:

$$W_w = R A_w^H (A_w R A_w^H + \lambda^2 I_N)^{-1} = (A_w^H A_w + \lambda^2 R^{-1})^{-1} A_w^H. \tag{9}$$

In the cost function, when no error term is considered as in the case of traditional parallel MRI reconstruction ($\lambda^2 = 0$), the regularization parameter $\lambda^2$ is zero. Thus, the inverse operator can be simplified as:

$$W_w = (A_w^H A_w)^{-1} A_w^H. \tag{10}$$

This is identical to the SENSE/SMASH reconstruction kernel. Note that the transition from under-determined InI MRI to over-determined parallel MRI is based on the incorporation of a prior error term in the cost function.

The traditional dynamic MRI image reconstructions provide a series of time-resolved images. Subsequent statistical analysis on the time-series images yields the statistical parametric maps (SPMs). However, in InI, we can normalize the reconstructed time-series image to the noise estimate to obtain SPMs at every time point. Due to the employed linear inverse, we have the estimate of the variance of the noise at source location $\rho$:

$$VAR(\vec{\epsilon}_\rho) = \langle (W_{w,\rho} n_w)(W_{w,\rho} n_w)^H \rangle = W_{w,\rho} W_{w,\rho}^H = W_\rho C W_\rho^H, \quad (16)$$

where $W_{w,\rho}$ indicates the $\rho$-th row of $W_w$, and $W_\rho$ indicates the $\rho$-th row of $W$.

When no assumption is made about the phase of the image to be reconstructed, a noise-normalized estimate of local image intensity power at location $\rho$ is given by $$f_\rho(t) = \frac{VAR(\hat{x}(t))}{VAR(\epsilon_\rho)} = \frac{|W_{w,\rho} y'_w(t)|^2}{W_{w,\rho} W_{w,\rho}^H} = \frac{|W_\rho y'(t)|^2}{W_\rho C W_\rho^H}. \quad (17)$$

Under the null hypothesis, $f_\rho(t)$ is F-distributed with 1 degree of freedom in the numerator and a large number of degrees of freedom in the denominator, which depends on the number of samples in the estimate of the noise covariance matrix. If phase-constraint is employed, we can further derive the following dynamic statistical interference to test the hypothesis about spin density to be either above or below the baseline:

$$z_\rho(t) = \frac{\hat{x}(t)}{\sqrt{VAR(\epsilon_\rho)}} = \frac{W_{w,\rho} y'_w(t)}{\sqrt{W_{w,\rho} W_{w,\rho}^H}} = \frac{W_\rho y'(t)}{\sqrt{W_\rho C W_\rho^H}}. \quad (18)$$

By dividing the estimated spin density over the FOV by the standard deviation of the estimate due to the contaminating noise, we have $z_\rho(t)$ following the t distribution under the null hypothesis of no spin density change ($\hat{x}'(t)=0$). When we utilize a large number of samples to estimate the noise covariance matrix, the t distribution approaches the unit normal distribution. Thus, $z_\rho(t)$ will be similar to the z-score.

Note that during derivation of dynamic statistical interference, the prior information ($x_0$) is not required. In other words, even without a priori information, spatially-resolved dynamic changes can be obtained from the accelerated difference observations between experimental conditions. In practice, we can define a "baseline" period in the time series experiment and calculate the differential data acquired with respect to that baseline. In this way, we rely only on the forward operator (and the associated inverse operator) in the reference scan to obtain spatially and temporally resolved statistical maps.

To quantify the spatial resolution in InI with minimum-norm estimate, we combine both the forward and inverse operator to form the resolution kernel:

$$\psi = WA = W_w A_w. \quad (19)$$

The columns of the resolution kernel specify the point spread function (PSF) for each source location, i.e., the spatial pattern of the estimated sources when a unit source is placed in a specific location. We can employ averaged PSF (aPSF) at location $\rho$ to quantify the spatial spread of the InI minimum-norm estimate:

$$aPSF_P = \frac{\sum_{i, i \neq \rho} |d_\rho(i)| \Psi_{i\rho}}{l}, \quad (20)$$

where $d_\rho(i)$ indicates the distance between source location I and source location $\rho$. $\psi_{i\rho}$ is the element from the $i^{th}$ row and $\rho^{th}$ column of the resolution kernel $\psi$, and 1 is the dimension of the source space. A map of spatial distribution of aPSF can be obtained by repeating the calculation across the whole source space.

DESCRIPTION OF THE PREFERRED EMBODIMENT

Referring particularly to FIG. 1, the preferred embodiment of the invention is employed in an MRI system manufactured by Siemens Medical Solution of Erlangen, Germany (1.5T Avanto). The MRI system includes a workstation 10 having a display 12 and a keyboard 14. The workstation 10 includes a processor 16 which is a commercially available programmable machine running a commercially available operating system. The workstation 10 provides the operator interface which enables scan prescriptions to be entered into the MRI system.

The workstation 10 is coupled to four servers: a pulse sequence server 18; a data acquisition server 20; a data processing server 22, and a data store server 23.

The pulse sequence server 18 functions in response to program elements downloaded from the workstation 10 to operate a gradient system 24 and an RF system 26. Gradient waveforms necessary to perform the prescribed scan are produced and applied to the gradient system 24 which excites gradient coils in an assembly 28 to produce the magnetic field gradients $G_x$, $G_y$ and $G_z$ used for position encoding NMR signals. The gradient coil assembly 28 forms part of a magnet assembly 30 which includes a polarizing magnet 32 and a whole-body RF coil 34.

RF excitation waveforms are applied to the RF coil 34 by the RF system 26 to perform the prescribed magnetic resonance pulse sequence. Responsive NMR signals detected by a separate RF coil array described below are received by the RF system 26, amplified, demodulated, filtered and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform.

The RF system 26 also includes a plurality of RF receiver channels. In the preferred embodiment 90 receiver channels are employed. Each RF receiver channel includes an RF amplifier that amplifies the NMR signal received by the coil to which it is connected and a quadrature detector which detects and digitizes the I and Q quadrature components of the received NMR signal. The magnitude of the received NMR signal may thus be determined at any sampled point by the square root of the sum of the squares of the I and Q components:

$$M = \sqrt{I^2 + Q^2},$$

and the phase of the received NMR signal may also be determined:

$\phi=\tan^{-1} Q/I.$

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 which receives signals from various sensors associated with the condition of the patient and the magnet system. It is also through the scan room interface circuit 38 that a patient positioning system 40 receives commands to move the patient to desired positions during the scan.

The digitized NMR signal samples produced by the RF system 26 are received by the data acquisition server 20. The data acquisition server 20 operates to receive the real-time NMR data and provide buffer storage such that no data is lost by data overrun. In some scans the data acquisition server 20 does little more than pass the acquired NMR data to the data processor server 22. However, in scans which require information derived from acquired NMR data to control the further performance of the scan, the data acquisition server 20 is programmed to produce such information and convey it to the pulse sequence server 18. For example, during prescans NMR data is acquired and used to calibrate the pulse sequence performed by the pulse sequence server 18. Also, navigator signals may be acquired during a scan and used to adjust RF or gradient system operating parameters or to control the view order in which k-space is sampled. And, the data acquisition server 20 may be employed to process NMR signals used to detect the arrival of contrast agent in an MRA scan. In all these examples the data acquisition server 20 acquires NMR data and processes it in real-time to produce information which is used to control the scan.

The data processing server 22 receives NMR data from the data acquisition server 20 and processes it in accordance with the image reconstruction method of the present invention. Images reconstructed by the data processing server 22 are conveyed back to the workstation 10 where they are stored. Real-time images may be output to operator display 12 or a display 42 which is located near the magnet assembly 30 for use by attending physicians. Batch mode images or selected real time images are stored in a host database on disc storage 44. The workstation 10 may be used by an operator to archive the images, produce films, or send the images via a network to other facilities.

To achieve an order-of-magnitude speedup in the acquisition of time-resolved MR images, spatial resolution is achieved using a multi-element rf coil array as an NMR signal detector rather than the usual time consuming image gradient encoding methods. The characteristics of the rf coil array that lend it to this application are as follows. A number coil elements are needed surrounding the object as completely as possible in a densely tiled arrangement. The spatial resolution of the invention is expected to increase as the number of spatially disparate detectors is increased. To provide spatially disparate information, the array elements should be uncoupled from one another. To provide both sensitivity and improved spatial information, the coils should be as close to the object as possible. If the array elements are for reception only, they should be detuned during the transmit phase of the MR experiment.

Figure 4:
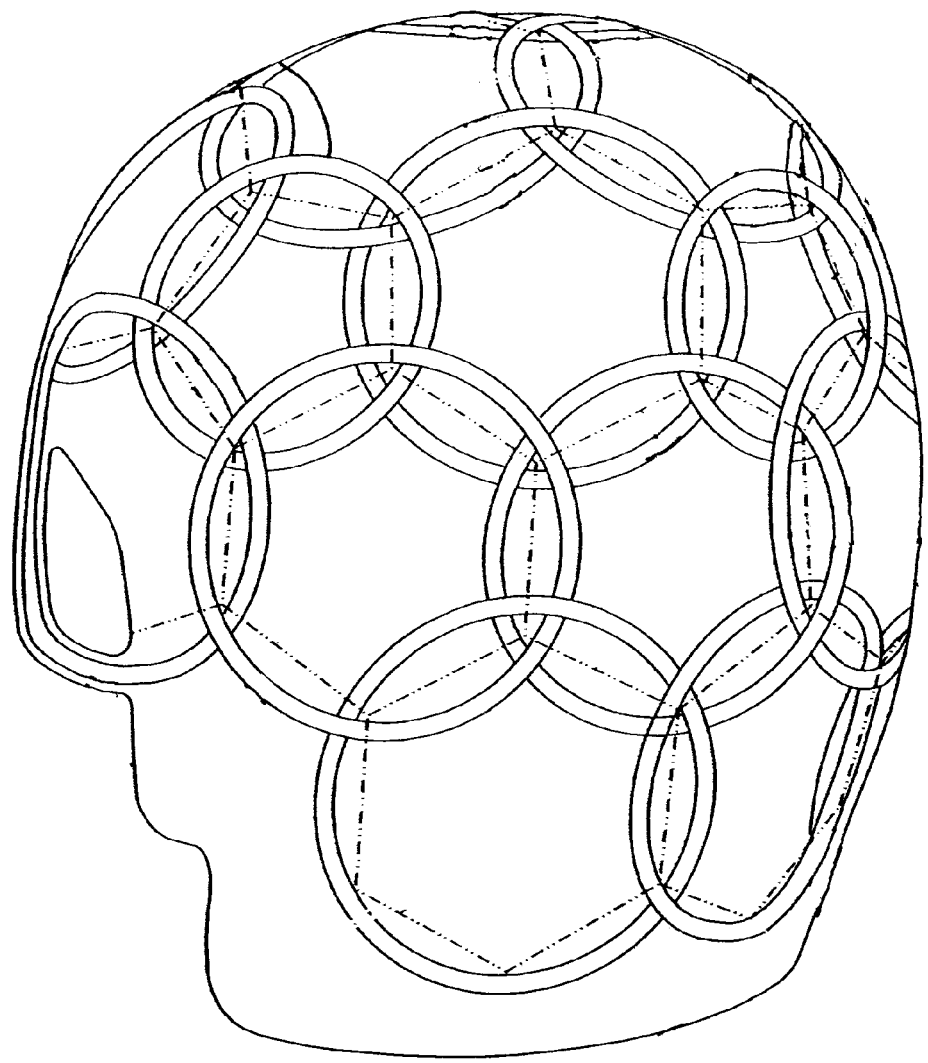
FIG. 4 is a pictorial representation of a 90-element coil used with the MRI system of FIG. 1 to practice the preferred embodiment of the invention.

Referring particularly to FIG. 4, in the preferred embodiment of the invention which is used to acquire images from the human brain a coil array 100 in the shape of a helmet is used. The close-fitting fiberglass helmet is modeled after the European head standard from EN960/1994 for protective headgear. This coil array 100 has 90 separate rf coil elements which are positioned over the curved helmet surface. Each coil element is substantially circular in shape and adjacent coil elements overlap such that their mutual inductance is minimized. As described in co-pending PCT application WO 2005/109010A2 filed on May 3, 2005 and entitled "Coil Array Positioning", inductive coupling between coil elements is reduced by overlapping adjacent coil elements and using preamplifier decoupling. The cable leading from each of the 90 coil elements to the preamplifier in its corresponding receiver channel is carefully chosen and the tuning of the matching circuit to the preamplifier is chosen to transform the high preamplifier input impedance to a low impedance across the circular coil element. An arrangement of hexagonal and pentagonal tiles cover the helmet surface, similar to a geodesic tiling of a sphere. Each tile has sides that are approximately 23 mm long although it was necessary to distort the pentagonal tiles is places in order to map them onto the surface of the helmet. A circular surface coil is centered on each one of the tiles. Each surface coil is made from 0.031 inch thick G10 copper clad circuit board with a conductor width of 2.5 mm. The diameter of each coil element ranges from 4.5 cm to 5.5 cm. It has been found that significant 5 to 8-fold gains in SNR are possible with this structure as compared to conventional head coils, particularly in the cerebral cortex.

In the preferred embodiment a series of MR images are acquired of the subject's brain while the subject is performing a prescribed function or while the subject is stimulated in a prescribed manner. MR data for a complete image is acquired each 20 msecs. during the dynamic study so that a high temporal resolution of the resulting brain activity is detected. Because the echo time (TE) needed to obtain maximum BOLD NMR signal response is much longer than 20 msecs (e.g., 43 msecs at 1.5 T) a PRESTO echo-shifting pulse sequence is used.

Figure 5:
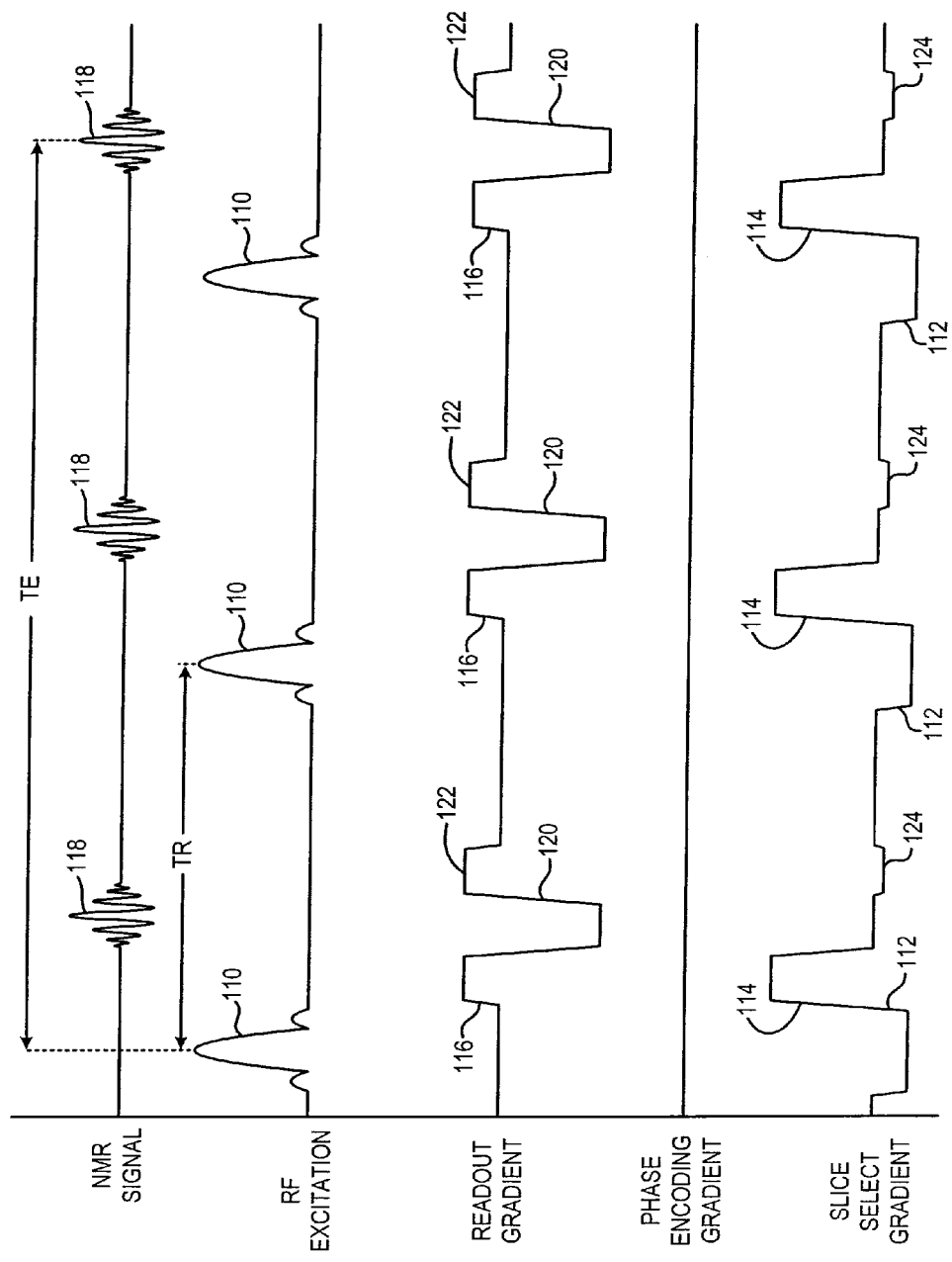
FIG. 5 is a graphic representation of a pulse sequence used to direct the MRI system of FIG. 1 when practicing the preferred embodiment.

Referring particularly to FIG. 5, the pulse sequence is initiated with a selective RF excitation pulse 110 having a flip angle of 20° produced in the presence of an off-resonance slice select gradient pulse 112. This is followed by a slice select rephasing gradient pulse 114 and a readout gradient pre-phasing gradient pulse 116. An NMR signal 118 is then acquired in the presence of a readout gradient pulse 120 and then the magnetization is refocused in the readout direction by a compensation gradient pulse 122. Of course, the NMR signal 118 is acquired separately by each of the 90 coil elements and each is slightly different due to the different location of each coil element. And finally, a compensation gradient pulse 124 is applied along the slice select axis to refocus part of the off-resonance excitation to prolong the echo-time (TE) into a later TR period. In the preferred embodiment this gradient pulse 124 is set to shift the echo time (TE) two TR periods to provide a TE of 43 msecs. There is no phase encoding gradient in this pulse sequence, a scan for one image frame is comprised of one pulse sequence in which a straight line through the center of k-space is sampled. This is referred to herein as a 1D InI scan in which one gradient encoding axis is eliminated by using the present invention.

Referring particularly to FIG. 5, the first step in a preferred fMRI implementation of the present invention is to acquire a series of image frames in a 1D InI scan as indicated at process block 200. This is accomplished using the above-described pulse sequence and the resulting 1D array of complex k-space samples from each of the 90 receivers and each of the acquired image frames is stored.

Figure 7:
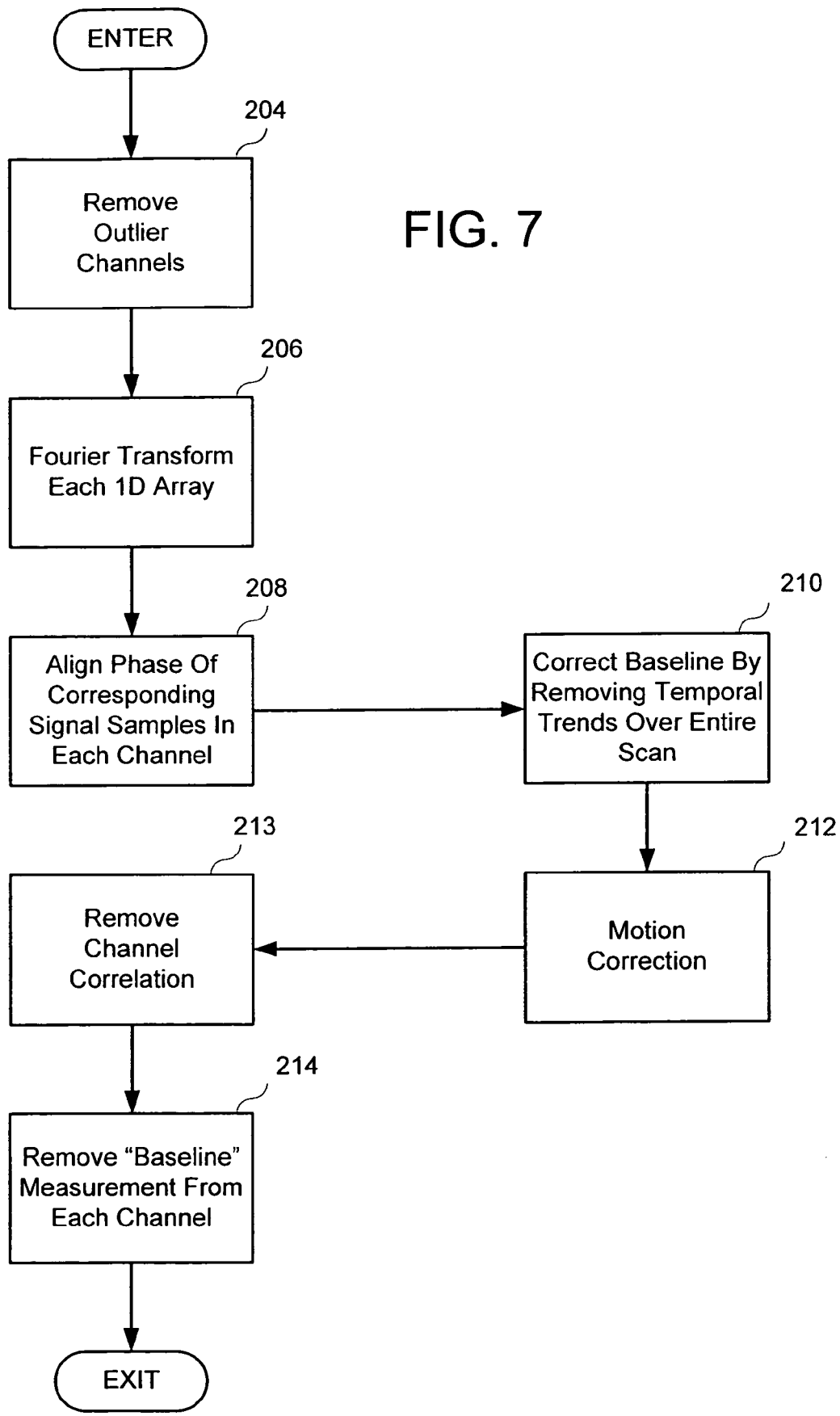
FIG. 7 is a flow chart which illustrates the steps used to prepare acquired k-space data in the method of FIG. 6.

Prior to reconstructing image frames from this k-space data using the inverse operator, the k-space data must be prepared as indicated at process block 202. The nature of this preparation depends to some extent on the particular scan being performed, but in the fMRI scan of the preferred embodiment, the preparation steps are illustrated in FIG. 7. As indicated at process block 204 in FIG. 7, this includes removing from the acquired k-space data any channels with bad measurements. This is accomplished by searching through the date from each channel and eliminating from consideration any channel with increased noise or decreased signal.

As indicated at process block 206, the 1D array of k-space data for each channel in each image frame is then Fourier transformed. This is a standard complex FFT which preserves the phase information in the I and Q components of the resulting signal samples. Each resulting signal sample is spatially resolved along the slice select axis and the readout gradient axis and the present invention is employed as described below to spatially resolve these signals along the third axis.

As indicated at process block 208, the preparation phase continues by aligning the phase of corresponding signal samples in each channel. This is accomplished by rotating each complex data point to have the same phase as the other timepoints which occur at the same latency with respect to the reference waveform. Phase alignment reduces phase instabilities in the data which may occur in the repetitive measurement.

As indicated at process block 210, the acquired fMRI image frames are further corrected by removing temporal trends in the data that appear over the entire acquisition time. This is accomplished by detrending the timeseries by subtracting a fitted polynomial or other set of basis functions from the data. Similarly, as indicated by process block 212, the acquired fMRI data is corrected for subject motion and other physiological noises. This is accomplished by correcting the phase of each signal sample in each image frame by an amount which offsets any detected patient motion during acquisition of each image frame. This is a well known correction common to fMRI post processing. For example, navigator signals can be periodically acquired during the scan as described in U.S. Pat. No. 5,539,312 and used to phase correct the fMRI data for patient motion.

As indicated at process block 213, the data preparation continues by removing the spatial correlation between channels in the array, as described in equation (3). This is done by calculating a noise covariance matrix C among the receiver channels as indicated at process block 222. This can be achieved by digitizing the signal for a short period in the absence of RF excitation. After acquiring C, we may perform Cholesky decomposition on C to obtain $C^{1/2}$ and its inverse $C^{-1/2}$. The prepared data are multiplied by $C^{-1/2}$ to achieve spatial de-correlation among array channels.

And finally, as indicated at process block 214, the baseline measurement is removed from each channel in each image frame as set forth above in Equation (4). In the fMRI scan a baseline measurement is typically made at the beginning of the scan before the patient is stimulated or starts a prescribed task. The corresponding signal samples in the 1D array of channel baseline measurements is subtracted from the corresponding channel measurements in each image frame. This is a complex subtraction that preserves the phase information. This completes the preparation phase of the acquired data which is now ready for inversion.

Figure 6:
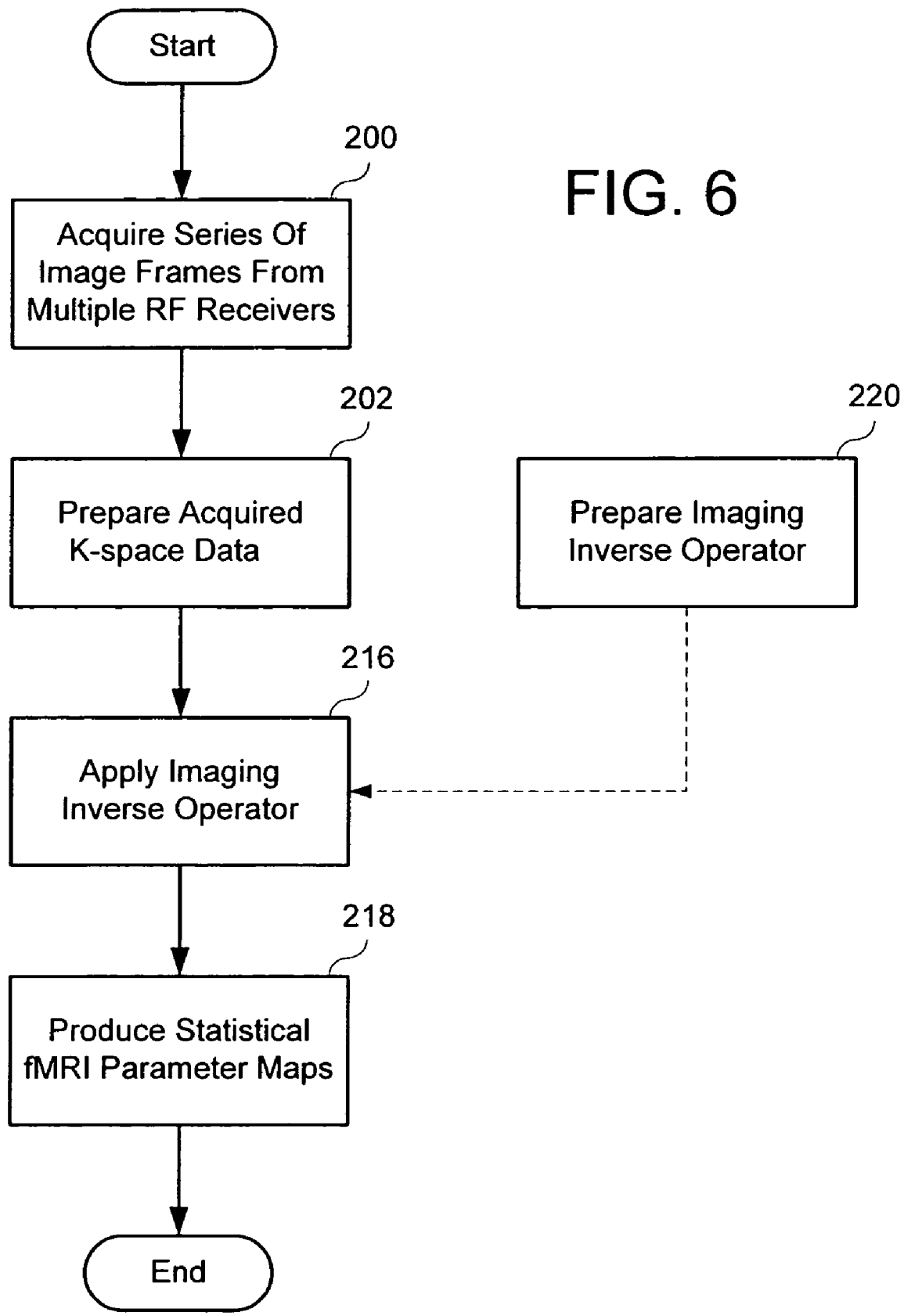
FIG. 6 is a flow chart which illustrates the steps used in the preferred embodiment of the invention.

A key step in the image reconstruction process is the transformation of the acquired data using an image inverse operator. Referring to FIG. 6, many of the calculations needed to produce the imaging inverse operator need only be calculated once and can be stored for later use. However, some of the calculations are subject dependent and receive coil dependent and must be calculated for each subject scan as indicated at process block 220. The steps required to accomplish this are set forth in FIG. 8.

To construct an inverse operator, we start from process block 228 to define source space. The source space represents possible locations in which the image will be reconstructed. In the most general case, the source space is the field of view of the image reconstructed with the present invention. If the spatial prior restricts this information, then the source space is reduced. For example, if only a limited number of spatial locations are expected to have dynamic change, then the source space may be restricted to this region. Restriction of the source space is beneficial for speeding up the inverse calculation and as a way to incorporate prior knowledge about the processes being studied by the image.

The construction of source continues by calculating coil sensitivity maps. Coil sensitivity maps $P_n$ in equation (2) are calculated as indicated at process block 224. The spatial sensitivity patterns of a coil can be estimated from low resolution MR images (magnitude and phase) acquired with minimal tissue contrast. If desired, anatomic information can be removed from this map by comparing to a similar scan acquired with the uniform body RF coil.

In addition, we also need the Fourier encoding part described in equation (2) as indicated in block 225. This can be done by using discrete Fourier transform matrix and a given k-space sampling pattern, as described in equation (2). The multiplication of the Fourier encoding part and the coil sensitivity map is done for each channel in the array. And the collection of all such multiplication from all channels in the array constitute the forward operator A, as described in equation (2).

The spatial correlation among channels in the forward operator is removed by using the noise covariance matrix C described above. After obtaining the Cholesky decomposition of C and its inverse $C^{-1/2}$, we multiple it with the forward operator A to obtain spatially whitened forward operator $A_w$, as described in equation (3c) and indicated in block 226.

As indicated at process block 227, the next step is to calculate the source covariance matrix (R) as set forth above in equation (7). The source covariance matrix may be constructed by a stationary full field of view image indicating the spatial distribution of the likelihood of the dynamic change. If a spatial prior is not desired, the identity matrix can be used.

To obtain an inverse operator, we also need a regularization parameter $\lambda^2$, as indicated by block 229. This is because in general we are dealing with an under-determined system, and thus, without a regularization parameter, the matrix between the parenthesis in equation (6) may become ill-conditioned. A regularization parameter can be estimated using an approach, such as a L-curve, generalized cross-validation, singular-value decomposition, or truncated singular-value decomposition. A regularization parameter may be also assigned as a fraction, for example, 5%, of the largest singular value of $A_w R A_w^H$ in equation (6).

Given regularization parameter $\lambda^2$, source covariance matrix R, and the whitened forward operator $A_w$, we now calculate the inverse operator $W_w$, as indicated at process block 231 and described in equation 6.

Referring again to FIG. 6, the next step is to apply the imaging inverse operator to the prepared image frame data as indicated at process block 216 using Equation (6). In Equation (6) $W_\nu$ is the imaging inverse operator, $y_\nu(t)$ is the prepared data. The result of this operation is the production of x'(t), a 2D image at each time frame in the dynamic study in which each image pixel indicates the BOLD response at the corresponding voxel in the subject's brain. The same inverse operator is used repetitively to transform the prepared time series data into time series images.

The last step in the fMRI process is to calculate statistical parameter maps as indicated at process block 218. We first estimate the variance of the noise during baseline (resting state) using equation (11). Subsequently, we derive, for example, dynamic F-statistic time series images using equation (12), or dynamic t-statistic time series using equation (13). Note that x'(t) has previously been calculated, which is time series images of estimated dynamic changes. There is no quantitative statistical significance associated with these estimated dynamic changes. In other words, x'(t) does not provide quantitative information about how likely it is different from the baseline. Using equation (11) to equation (13), we can derive the time-point by time-point quantitative likelihood (or statistics of different types) of the estimated activity different from the baseline.

While the present invention is particularly useful in fMRI applications, it is also useful in other applications where very high temporal resolution is needed. In addition to eliminating the need for gradients to spatially encode for one, two or three axes, the present invention can also be employed in situations where gradient spatial encoding is not eliminated, but merely reduced in resolution. For example, rather than eliminating the phase encoding gradient entirely as is done in the above preferred embodiment, a limited number of phase encoding steps may be employed to increase spatial resolution. The greater the number of phase encoding steps used the longer the scan time and the higher the resolution of the acquired frame images. The choice is thus a trade off between image resolution on the one hand and scan time or temporal resolution.

The invention claimed is:

1. A method for producing an image of a subject with a magnetic resonance imaging (MRI) system, the steps comprising:
   a) performing a pulse sequence with the MRI system to produce transverse magnetization in the subject that emits NMR signals;
   b) receiving the NMR signals simultaneously with multiple coils and associated receive channels;
   c) preparing an inverse image from the received NMR signals; and
   d) reconstructing an image from the inverse image using an imaging inverse operator;
   wherein the imaging inverse operator is based on a forward model that accounts for the NMR signals received by each coil and associated receive channel.

2. The method as recited in claim 1 in which step c) includes:
   c)i) Fourier transforming the received NMR signals.

3. The method as recited in claim 1 in which performing the pulse sequence in step a) includes:
   a)i) applying an image gradient along one axis to position encode the NMR signals received in step b); and
   step c) includes:
   c)i) preparing the received NMR signals by Fourier transforming them.

4. The method as recited in claim 3 in which the image gradient is applied as the NMR signals are received.

5. The method as recited in claim 1 in which the pulse sequence does not employ an image gradient to resolve NMR signal position along one image axis and NMR signal position is resolved along said image axis by application of the inverse operator in step d).

6. The method as recited in claim 1 in which step c) includes:
   c)ii) aligning the phase of corresponding NMR signals from each coil.

7. The method as recited in claim 1 in which step c) includes:
   c)iii) removing spatial correlation between the NMR signals in each receive channel.

8. The method as recited in claim 7 in which step c)iii) includes calculating a noise covariance matrix among the receive channels.

9. The method as recited in claim 1 which includes:
   e) calculating the imaging inverse operator by:
   e)i) calculating a coil sensitivity map for each of said multiple coils:
   e)ii) producing a forward operator A from the coil sensitivity maps; and
   e)iii) producing the imaging inverse operator using the forward operator A.

10. The method as recited in claim 9 in which step e)iii) includes:
    calculating a noise covariance matrix among the receive channels;
    calculating a spatially whitened forward operator $A_w$ using the forward operator A and the covariance matrix; and
    wherein the imaging inverse operator is produced from the whitened forward operator $A_w$.

11. The method as recited in claim 9 which includes calculating a source covariance matrix R using known information about the subject being imaged; and
    wherein the imaging inverse operator is produced in step e)iii) using the source covariance matrix R.

12. The method as recited in claim 9 which includes calculating a regularization parameter $\lambda^2$; and
    wherein the imaging inverse operator is produced in step e)iii) using the regularization parameter $\lambda^2$.

* * * * *

UNITED STATES PATENT AND TRADEMARK OFFICE
CERTIFICATE OF CORRECTION

| | | |
|---|---|---|
| PATENT NO. | : 7,394,251 B2 | Page 1 of 1 |
| APPLICATION NO. | : 11/484091 | |
| DATED | : July 1, 2008 | |
| INVENTOR(S) | : Fa-Shuan Lin | |

It is certified that error appears in the above-identified patent and that said Letters Patent is hereby corrected as shown below:

Column 1, Line 3, after the Title, insert the following paragraph:

--STATEMENT REGARDING FEDERALLY SPONSORED RESEARCH

This invention was made with United States Government support under Grant Nos. HD040712, RR 014075 and NS037462 awarded by the National Institutes of Health. The United States Government has certain rights in this invention.--

Signed and Sealed this

Twenty-eighth Day of April, 2009

JOHN DOLL
*Acting Director of the United States Patent and Trademark Office*